(12) United States Patent
Kono

(10) Patent No.: US 6,459,146 B2
(45) Date of Patent: Oct. 1, 2002

(54) SEMICONDUCTOR APPARATUS

(75) Inventor: Eiji Kono, Aichi-ken (JP)

(73) Assignee: Kabushiki Kaisha Toyoda Jidoshokki Seisakusho, Kariya (JP)

(*) Notice: Subject to any disclaimer, the term of this patent is extended or adjusted under 35 U.S.C. 154(b) by 0 days.

(21) Appl. No.: 09/836,939

(22) Filed: Apr. 18, 2001

(30) Foreign Application Priority Data

Apr. 21, 2000 (JP) ....................................... 2000-120965

(51) Int. Cl.$^7$ ............................................. H01L 23/495
(52) U.S. Cl. ........................ 257/676; 257/690; 257/723; 257/724; 257/725
(58) Field of Search ................................ 257/110, 690, 257/700, 701, 711, 723, 724, 725, 784, 676

(56) References Cited

U.S. PATENT DOCUMENTS 5,309,014 A * 5/1994 Wilson ........................ 257/584
5,347,158 A * 9/1994 Matsuda et al. ............. 257/691
5,569,957 A * 10/1996 McLean ....................... 257/691
6,020,636 A * 2/2000 Adishian ...................... 257/728
6,330,165 B1 * 12/2001 Kohjiro et al. ............... 257/693

FOREIGN PATENT DOCUMENTS

JP          A-08-340082        12/1996

* cited by examiner

Primary Examiner—David Nelms
Assistant Examiner—Andy Huynh
(74) Attorney, Agent, or Firm—Woodcock Washburn LLP

(57) ABSTRACT

An electrode wiring structure is disclosed which realizes a smaller semiconductor apparatus as a power semiconductor module with the current path set as shortest as possible. The semiconductor apparatus includes: a plurality of semiconductor devices mounted in one array or more on a substrate; a main current electrode mounted along the array(s) of the semiconductor devices, and commonly connected to each of the plurality of semiconductor devices through the substrate by being connected to the substrate through a plurality of wires; an insulated base mounted on the main current electrode, and covering the connection area of the wires connecting the main current electrode; and a drive electrode mounted on the base, and commonly connected to each of the semiconductor devices.

9 Claims, 6 Drawing Sheets

SEMICONDUCTOR APPARATUS

BACKGROUND OF THE INVENTION

1. Field of the Invention

The present invention relates to a semiconductor apparatus used mainly as a switching device in, for example, a motor drive device in an inverter, an AC servomotor, an air conditioner, etc., or a power supply device in a vehicle, a welding machine, etc., and more specifically to the improvement of an electrode wiring structure in a semiconductor apparatus applicable as a power semiconductor module.

2. Description of the Related Art

Normally, a semiconductor module can be, for example, a plurality of semiconductor devices (semiconductor chips) connected in parallel to have a larger current capacity, a simple circuit of several types of semiconductor devices, semiconductor devices into which a drive circuit is incorporated, etc.

FIG. 1 is a plan view of an example of a conventional power semiconductor module.

In the semiconductor module shown in FIG. 1, an insulated substrate 2 is mounted on a base plate 1 for fixing. On the insulated substrate 2, a plurality of (four as an example shown in FIG. 1) semiconductor devices (semiconductor chips) 4 are mounted in series through a conductive plate 3. In this example, the semiconductor device 4 is a MOSFET (metal oxide semiconductor field-effect transistor) having a source electrode and a gate electrode on the top side, and a drain electrode on the reverse side.

The conductive plate 3 is electrically connected commonly to the drain electrode of each semiconductor device 4 by mounting the semiconductor device 4 directly on it, thereby functioning as a drain electrode of the entire module. On the insulated substrate 2, a source electrode 5 and a gate electrode 6 of the entire module are respectively mounted along the array of the semiconductor devices 4 and on either side of the conductive plate (drain electrode) 3 on which the semiconductor devices 4 are mounted.

The source electrode 5 is electrically connected commonly to the source electrode of each semiconductor device 4 through a wire (bonding wire) 7, and the gate electrode 6 is electrically connected commonly to the gate electrode of each semiconductor device 4 through a wire (bonding wire) 8. A gate resistor such as a silicon chip resistor, etc. can be provided on the gate electrode 6, and the wire 8 can be connected thereto.

Furthermore, a drain terminal 9 is led outside the module as an external terminal from a portion of the conductive plate (drain electrode) 3, a source terminal 10 is led outside the module as an external terminal from a portion of the source electrode 5, and a gate terminal 11 is led outside the module as an external terminal from a portion of the gate electrode 6.

Although not shown in the attached drawings, the entire module is normally put in a resin package, and the space in the package is filled with gel or epoxy resin, etc. The above mentioned external terminal is drawn in a two-dimensional array in FIG. 1, but it is appropriately bent and exposed on the top or side of the package.

The semiconductor module with the above mentioned configuration has a plurality of semiconductor devices 4 connected in parallel between the drain terminal 9 and the source terminal 10. Therefore, in principle, the main current flowing between the drain terminal 9 and the source terminal 10 can be controlled by applying a control voltage between the gate terminal 11 and the source terminal 10, and simultaneously setting all semiconductor devices 4 ON/OFF.

In the conventional semiconductor module as shown in FIG. 1, restrictions are placed by the gate electrode 6 especially on the wiring pattern from the drain electrode (conductive plate) 3 to the drain terminal 9. That is, the drain terminal 9 is led outside through the path from the end portion of the conductive plate 3 without passing the gate electrode 6.

Therefore, the lengths of the current paths are entirely long when the main current flows from the drain terminal 9 to the source terminal 10 through each semiconductor device 4, and the lengths are uneven depending on the position of each semiconductor device 4. Especially, the current path through the semiconductor device 4 shown in FIG. 1 on the right is considerably longer than the current path through the semiconductor device 4 on the left.

Since the inductance generated in the current path is substantially proportional to the length of the path, the inductance increases correspondingly when the current path is long as described above. As a result, the surge voltage generated when the semiconductor device 4 is turned off rises, thereby possibly destroying the semiconductor device 4.

In addition, when the lengths of current paths are not even, the wiring resistance also becomes uneven depending on the position of each semiconductor device 4. As a result, the current value becomes unbalanced, thereby leading excess current through only a part of the semiconductor devices 4, and also possibly destroying the semiconductor devices 4. Therefore, with the problem of the above mentioned excess current to a part of the semiconductor devices 4 has prevented the maximum current through the module from largely increasing.

Furthermore, with the drain terminal 9 directly connected to the conductive plate 3 to be mounted on the insulated substrate 2 as the semiconductor module as shown in FIG. 1, there can easily be a crack in the joint (the portion encompassed by a circle A indicated by a dot-and-dash line) between the drain terminal 9 and the conductive plate 3 due to the expansion and contraction by the heat from the semiconductor devices 4.

Therefore, to solve the above mentioned problems, the Applicant of the present invention has suggested a semiconductor module having the structure as shown in FIG. 2.

In the semiconductor module shown in FIG. 2, there is the conductive plate 3 mounted on the insulated substrate 2 having a drain electrode 12 on one side, and the source electrode 5 on the other side. On the drain electrode 12, the gate electrode 6 is mounted through an insulating plate (insulating layer) 13.

Furthermore, the drain electrode 12 is connected to the conductive plate 3 through a plurality of wires 14 equally arranged at predetermined distances from one another along the array of the semiconductor devices 4. Thus, the drain electrode 12 is commonly connected to each of the semiconductor devices 4 through the wires 14 and the insulating plate 13.

In addition, two drain terminals 9 are led from the drain electrode 12, and two source terminals 10 are led from the source electrode 5. These drain terminals 9 and source terminals 10 are provided on either side of the conductive plate 3.

With the above mentioned configuration, the drain electrode 12 and the conductive plate 3 are connected through the wires 14 arranged at predetermined distances along the array of the semiconductor devices 4. Therefore, the drain electrode 12 and the insulating plate 13 are equivalent to the structure in which they are directly connected on their sides (the plane along the above mentioned array direction). Therefore, the main current flows substantially straight from the drain electrode 12 to each of the semiconductor devices 4 through the conductive plate 3, and then straight to the source electrode 5. Since the drain terminal 9 and the source terminal 10 are opposite each other, the main current flows substantially straight from the drain terminal 9 to the source terminal 10 through the shortest path.

Thus, since the current path of the main current flows substantially straight from the drain terminal 9 to the source terminal 10, the length of the current path can be the shortest possible. As a result, the inductance can be reduced, and the surge voltage can be suppressed, thereby enhancing the reliability of the entire module.

Furthermore, since the length of the current path can be leveled in the module regardless of the position of each semiconductor device 4, the wiring resistance can be leveled through each current path. As a result, a current does not flow excessively through only a part of the semiconductor devices, thereby leveling the value of the main current, and increasing the maximum current through the entire module.

Furthermore, since the drain electrode 12 is not directly connected to the conductive plate 3, but they are connected indirectly through the wire 14, the conventional crack can be effectively prevented although the semiconductor devices 4 repeat expansion and contraction by their heat.

Thus, with the semiconductor module shown in FIG. 2, the above mentioned problems with the conventional semiconductor module shown in FIG. 1 can be effectively solved.

However, with the configuration in which the drive gate electrode 6 is mounted on the drain electrode 12, the drain electrode 12 requires the space for the gate electrode 6 and the wire 14 for connection as clearly shown in FIG. 3 which is an enlarged sectional view along B—B shown in FIG. 2. Therefore, the width W1 of the drain electrode 12 is necessarily be large, thereby preventing the realization of a smaller apparatus.

SUMMARY OF THE INVENTION

An object of the invention is to provide a smaller semiconductor apparatus with the above mentioned problems with the conventional technology (increasing surge voltage, unbalanced current, cracks, etc.) successfully solved.

To attain the above mentioned object, the present invention has the following configuration.

That is, the semiconductor apparatus according to the present invention includes: a plurality of semiconductor devices mounted in one or more arrays on a substrate; a main current electrode mounted along the array(s) of the semiconductor devices, and commonly connected to each of the plurality of semiconductor devices through the substrate by being connected to the substrate through a plurality of wires; an insulated base mounted on the main current electrode, and covering a joint area between the main current electrode and the wires; and a drive electrode mounted on the base, and commonly connected to each of the plurality of semiconductor devices.

The substrate can be a conductive plate or a conductive layer mounted on an insulated substrate. However, it is obvious that other configurations can be accepted only if a path of the main current flowing from the main current electrode to each of the semiconductor devices can be provided.

The above mentioned main current electrode is a drain electrode or a source electrode when the semiconductor device is, for example, a MOSFET. It also can be a collector electrode or an emitter electrode when the semiconductor device is, for example, a bipolar transistor. The main current electrode is indirectly connected to each semiconductor device through the substrate, that is, connected to the substrate through a wire to form a current path of the main current flowing from the main current electrode to each semiconductor device through the wire and the substrate.

Furthermore, the above mentioned drive electrode is a gate electrode when the semiconductor device is, for example, a MOSFET. It can also be a base electrode when the semiconductor device is, for example, a bipolar transistor. Assuming that the semiconductor device is a MOSFET is used, the drive voltage is normally applied to the gate electrode and the source electrode. Therefore, a drive source electrode can be provided in addition to the source electrode for the main current. In this case, the drive source electrode can be regarded also as the above mentioned drive electrode.

The insulated base does not necessarily indicate an insulating material, but can be accepted only if it insulates the main current electrode from the drive electrode. For example, an insulated base can be obtained by providing an insulating layer on or below a base to insulate the main current electrode from the drive electrode.

According to the present invention, the main current electrode is provided along the array of the semiconductor devices, and the substrate is connected to the main current electrode through a plurality of wires arranged along the array of the semiconductor devices. The plurality of wires are desired to be equally arranged along the array of the semiconductor devices, but are not limited to this arrangement.

With the above mentioned configuration, the main current electrode is actually connected to the substrate indirectly through a plurality of wires. However, since the plurality of wires are arranged along the array of the semiconductor devices, the main current electrode is practically connected to the substrate directly on their sides (planes along the array of the semiconductor devices). Therefore, the main current flows substantially straight from the main current electrode to each semiconductor device through the substrate.

Thus, since the current path of the main current is formed substantially straight from the main current electrode regardless of the position of each semiconductor device, the current path can be the shortest possible, and is leveled. As a result, the inductance can be reduced, and the surge voltage can be suppressed, thereby leveling the main current flowing through each semiconductor device, and increasing the maximum current in the entire semiconductor apparatus (semiconductor module).

Furthermore, the main current electrode is not actually connected directly to the substrate, but is indirectly connected through wires, thereby suppressing the generation of cracks in the joint portions due to the expansion and contraction of the semiconductor devices.

Furthermore, an insulated base is mounted on the main current electrode, and the base covers the connection area between the main current electrode and the wire. The drive electrode is mounted on the base having the above mentioned configuration.

With the above mentioned configuration, the mounting area of the drive electrode on the insulated base can be set close to the semiconductor devices at the position for coverage over the connection area of the wires (that is, such that the mounting area can overlap the connection area of the wires).

As a result of setting the drive electrode closer to the semiconductor devices, the width of the main current electrode can be smaller, thereby realizing a smaller apparatus. Furthermore, as a result of setting the drive electrode closer to the semiconductor devices, the wire connecting the drive electrode to each semiconductor device can be shorter, and the inductance generated in the wire can be reduced.

Various types of structures of the base can be designed. For example, it is desired that the side of the semiconductor devices is beveled and the beveled surface covers the connection area.

DESCRIPTION OF THE PREFERRED EMBODIMENTS

The embodiments of the present invention are described below in detail by referring to the attached drawings.
<Embodiment of the Present Invention>

Figure 1:
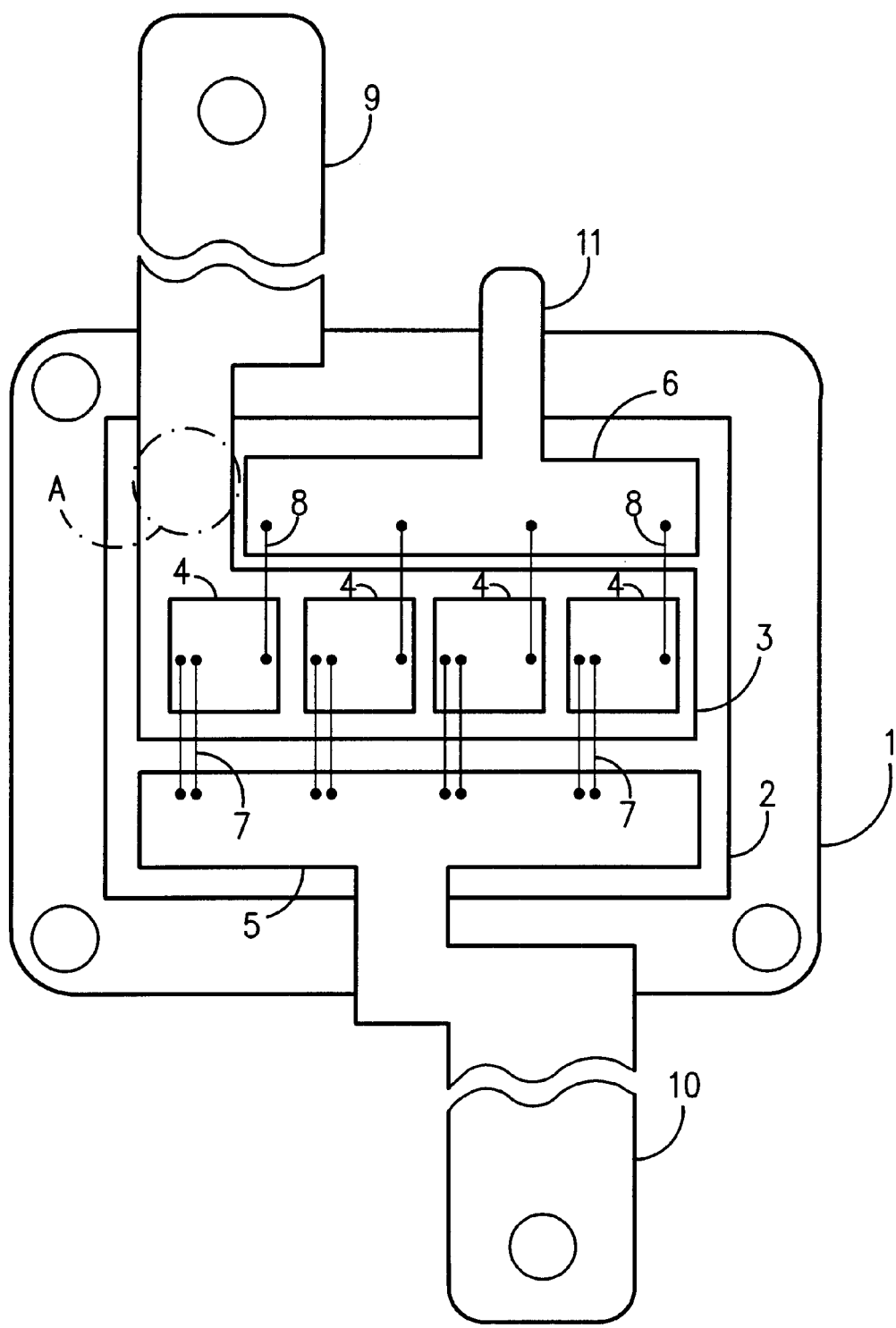
FIG. 1 is a plan view of the conventional power semiconductor module.
Figure 4:
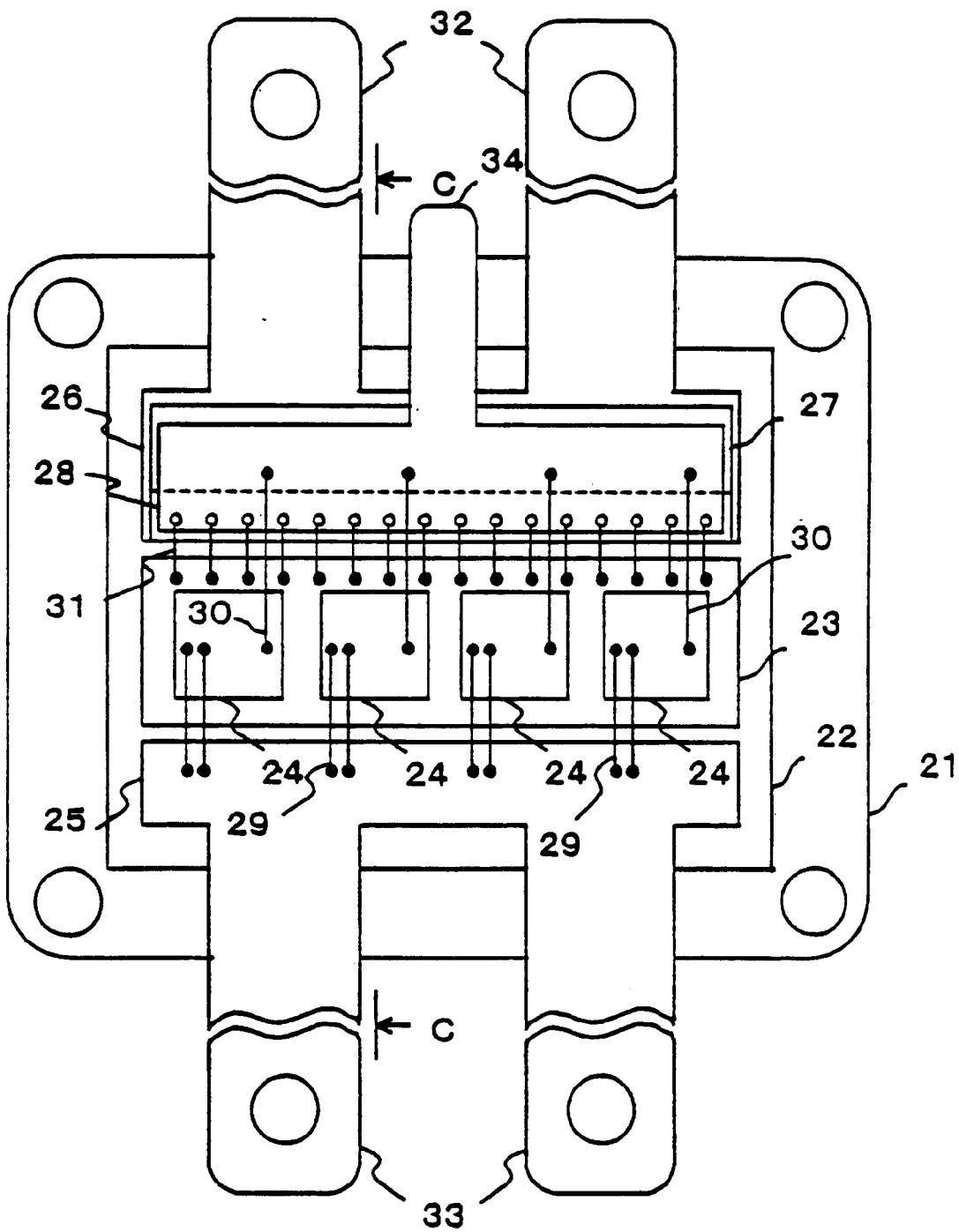
FIG. 4 is a plan view of the power semiconductor module according to an embodiment of the present invention.

In the semiconductor module for electric power according to an embodiment of the present invention shown in FIG. 4, an insulated substrate 22 comprising ceramic insulator, etc. is mounted on a base plate 21 for fixing as in the configuration of the conventional technology shown in FIG. 1. On the insulated substrate 22, a plurality of (four in FIG. 4) semiconductor devices (semiconductor chips) 24 are mounted in an array through a conductive plate (conductive layer) 23 made of a conductive material such as copper, etc. In this example, the semiconductor device 24 is a MOSFET having a source electrode and a gate electrode on the top side, and a drain electrode on the reverse side. The conductive plate 23 is electrically connected commonly to the drain electrode of each semiconductor device 24 by mounting the semiconductor device 24 directly on it.

On the insulated substrate 22, a source electrode 25 and a drain electrode 26 of the entire module are respectively mounted along the array of the semiconductor devices 4 and on either side of the conductive plate 23 on which the semiconductor device 24 are mounted. Furthermore, on the drain electrode 26, the unique insulated base 27 is mounted, and a gate electrode 28 of the entire module is mounted on the insulated base 27. These electrodes are made of conductive materials such as copper, etc. The insulated base 27 is described later in detail.

The source electrode 25 is electrically connected commonly to the source electrode of each semiconductor device 24 through a wire (bonding wire) 29. A gate electrode 28 is electrically connected commonly to the gate electrode of each semiconductor device 24 through a similar wire 30.

The drain electrode 26 is connected to the conductive plate 23 through a plurality of wires 31 equally arranged at predetermined distances along the array of the semiconductor devices 24. Thus, the drain electrode 26 is commonly connected to each semiconductor device 24 through the wire 31 and the conductive plate 23. The length of each wire 31 is set the shortest possible but long enough to connect the conductive plate 23 to the drain electrode 26. That is, the conductive plate 23 is connected to the drain electrode 26 straight (on the plan view) at the shortest possible distance.

Two drain terminals 32 are led outside the module from the drain electrode 26. Two source terminals 33 are led outside from the source electrode 25. The drain terminals 32 and the source terminals 33 are set opposite each other on either side of the conductive plate 23 which is a mounting area of the semiconductor devices 24. A gate terminal 34 is led outside from the gate electrode 28.

Although not shown in the attached drawings, the entire module is normally put in a resin package, and the space in the package is filled with gel or epoxy resin, etc. The above mentioned external terminal (drain terminal 32, source terminal 33, and gate terminal 34) is drawn in a two-dimensional array in FIG. 1, but it is appropriately bent and exposed on the top or side of the package.

Figure 5:
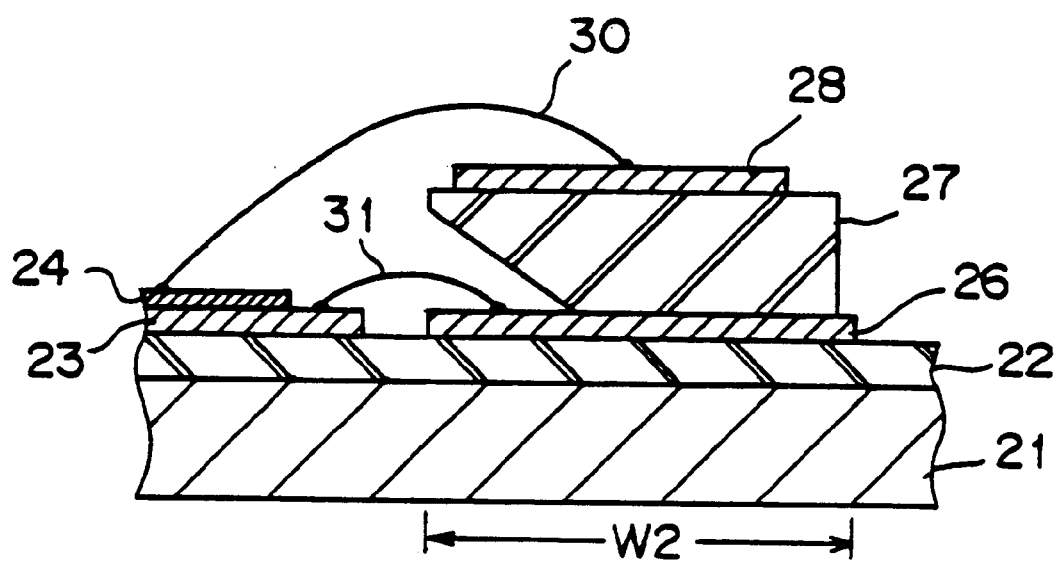
FIG. 5 is an enlarged sectional view along C—C shown in 2.

The insulated base 27 is described below in detail by referring to FIG. 5 showing an enlarged sectional view through C—C shown in FIG. 4.

The insulated base 27 is a thick insulating plate of plastic, etc., and is flat on the top surface with the side facing the semiconductor devices 24 beveled. The beveled side covers the connection area of the wire 31. Using the beveled side, the interference between the insulated base 27 and the wire 31 can be suppressed although the insulated base 27 is set exactly close to the semiconductor device 24. In this case, the thickness of the insulated base 27, the angle of the bevel, etc. can be appropriately set in a range in which the interference with the wire 31 can be avoided.

Then, on the insulated base 27, the gate electrode 28 is set as close as possible to the semiconductor device 24 so that the gate electrode 28 can cover the connection area of the wire 31. This process can be checked by the plan view shown in FIG. 4. That is, the mounting area of the gate electrode 28 overlaps the connection area of the wire 31.

To produce the semiconductor module having the above mentioned insulated base 27, the drain electrode 26 is connected to the conductive plate 23 are connected through the wire 31. Then, after the insulated base 27 is fixed to a predetermined position on the drain electrode 26 using, for example, heat-hardening silicon adhesives, etc., the gate electrode 28 is mounted and the wire 30 is connected.

Various methods can be used to set the insulated base 27 at a predetermined position on the drain electrode 26. For example, the reverse side of the insulated base 27 and the top surface of the drain electrode 26 are provided with convexity and concavity for coupling through which the insulated base 27 can be easily positioned.

The semiconductor module with the above mentioned configuration has a plurality of semiconductor devices 24 connected in parallel between the drain terminal 32 and the source terminal 33. Therefore, in principle, the main current flowing between the drain terminal 32 and the source terminal 33 can be controlled by applying a control voltage between the gate terminal 34 and the source terminal 33, and simultaneously setting all semiconductor devices 24 ON/OFF.

Figure 2:
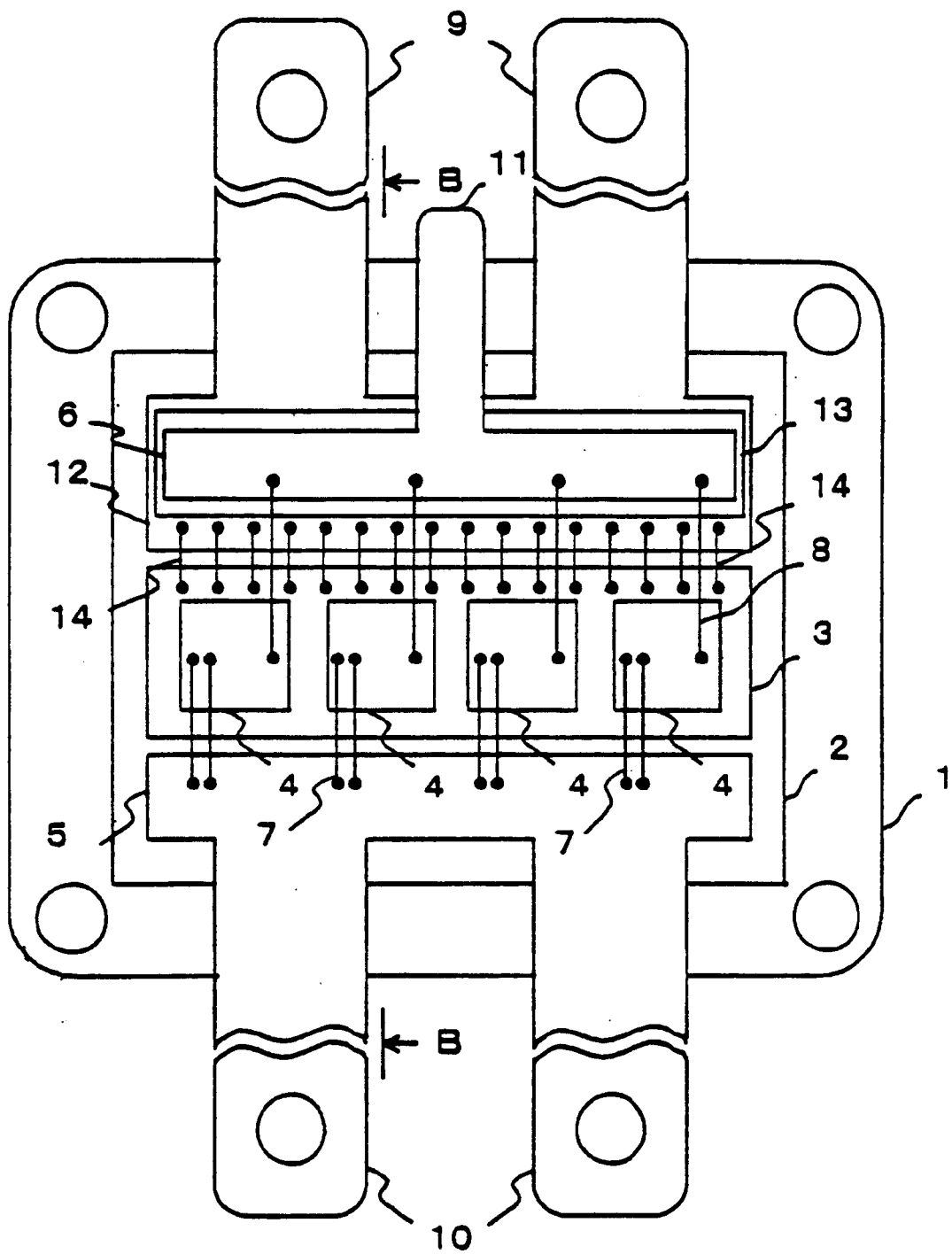
FIG. 2 is a plan view of the power semiconductor module after solving the problems with the conventional power semiconductor module.

According to the present embodiment, various problems with the conventional semiconductor module shown in FIG. 1 can be effectively solved as in the semiconductor module shown in FIG. 2.

That is, since the current path of the main current can be formed substantially straight from the drain terminal 32 to the source terminal 33, the current path can be considerably shorter, and leveled entirely. As a result, the inductance can be reduced and the surge voltage can be suppressed, thereby leveling the value of the main current through each semiconductor device 24, and increasing the maximum current in the entire module.

Furthermore, since the drain electrode 26 is indirectly connected to the conductive plate 23 through the wire 31, the conventional cracks can be suppressed although the semiconductor device 24 repeats expansion and contraction by its heat.

Figure 3:
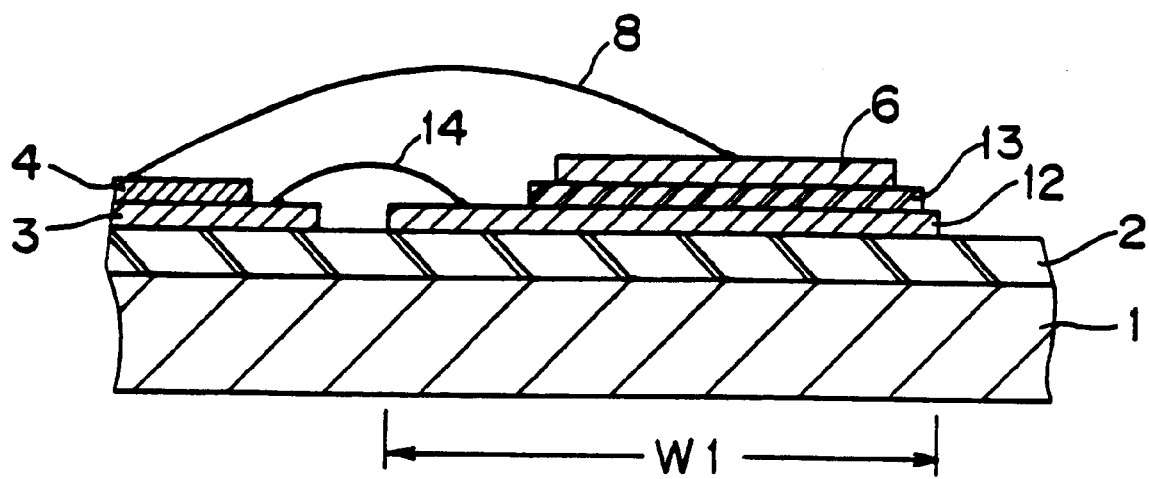
FIG. 3 is an enlarged sectional view along B—B shown in FIG. 2.

Additionally, by adopting the unique insulated base 27 according to the present embodiment, the gate electrode 28 can be set as close as possible to the semiconductor device 24 to cover the connection area of the wire 31. This reduces the width W2 (shown in FIG. 5) of the drain electrode 26. It is clear as compared with the case of the width W1 of the drain electrode 12 shown in FIG. 3. Thus, the entire module can be remarkably smaller.

In addition, since the gate electrode 28 is set close to the semiconductor device 24, the wire 30 can be shorter, thereby successfully reducing the inductance of the wire 30.

<Other Embodiments>

The present invention is not limited to the above mentioned embodiment, but various configurations can be used in the scope disclosed by the claims of the invention. For example, the following variations of the configuration can be adopted.

Figure 6:
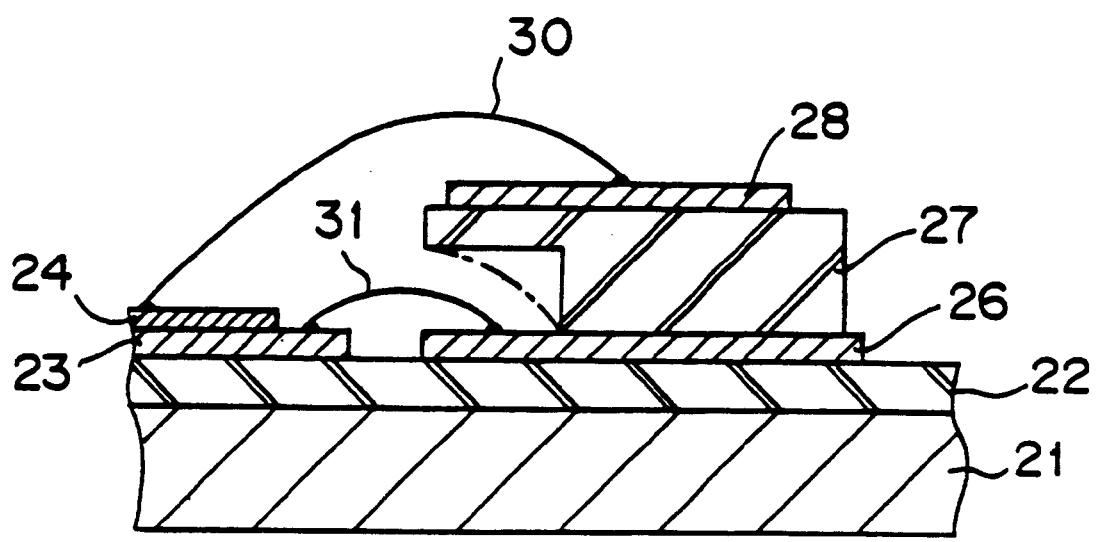
FIG. 6 is an enlarged sectional view of a variation of the insulated base 27.

(1) In the above mentioned embodiment, one side of the insulated base 27 is beveled, but the form of the beveled side can be varied as long as it does not interfere with the wire 31. For example, as shown in FIG. 6, the insulated base 27 can be cut to make a right angle, or cut to make a curve along the curve of the wire 31 as indicated by the dot-and-dash line shown in FIG. 6.

(2) The insulated base 27 is not necessarily made of a single insulating material, but can be produced by combining a plurality of materials. For example, instead of totally using an insulating material, only a lower or upper area can be made of an insulating plate or layer, and a larger part of the insulated base 27 can be made of a conductive material such as metal, etc. It is obvious that the entire structure is made of an insulating material in consideration of the problem of the interference with wires, etc.

(3) In the above mentioned embodiment, the plurality of wires 31 connecting the drain electrode 26 to the conductive plate 23 are arranged at predetermined distances. However, they do not necessarily have to be arranged at predetermined distances, but at different distances.

(4) In the above mentioned embodiment, two drain terminals 32 and two source terminals 33 are used, but a single drain terminal 32 and a single source terminal 33 can be used with an acceptable effect of leveling the current path. Three or more units each can be acceptable.

(5) In the above mentioned embodiment, a plurality of semiconductor devices 24 are arranged in an array as an example. That is, two or more arrays of the devices can be applied according to the present invention.

(6) The structure of the substrate on which semiconductor devices are mounted is not limited to the configuration shown in the attached drawings. That is, in FIG. 4, the conductive plate 23 is mounted on the insulated substrate 22, and the semiconductor device 24 is mounted on the conductive plate 23. However, according to the present invention, the semiconductor devices can also be mounted directly on the conductive substrate. When such a conductive substrate is adopted, a drain electrode and a source electrode can be mounted on the substrate through an insulating layer.

Furthermore, it is not necessary to mount semiconductor devices and all electrodes on one substrate. That is, the semiconductor device and each electrode can be mounted on different substrates or bases, and then incorporated as a package.

(7) As an external drive terminal, not only the gate terminal 34 is led outside, but a source drive terminal can be branched from the source terminal 33, and be set close to the gate terminal 34.

Otherwise, a source drive electrode is provided on the insulated base 27 and close to the gate electrode 28, and, from the gate electrode and the source electrode, a gate terminal and a source terminal can be led outside.

(8) Not only one semiconductor module has one transistor function, but a plurality of transistor function can be incorporated into one semiconductor module according to the present invention.

(9) In the explanation above, a MOSFET is used as a semiconductor device. However, a semiconductor device can be, for example, a bipolar transistor, a thyristor, an IGBT (insulated gate bipolar transistor), a GTO (gate turn-off thyristor), etc.

As described above, according to the present invention, an electrode wiring structure can be devised to prevent cracks in the structure, and the current path of the main current can be shorter and leveled, thereby reducing the surge voltage, improving the reliability of the apparatus, and increasing the maximum current in the entire apparatus.

Furthermore, by adopting a unique insulated base, the width of the main current electrode can be shorter. As a result, a smaller apparatus can be realized with reduced inductance.

What is claimed is:

1. A semiconductor apparatus, comprising:
a plurality of semiconductor devices mounted in one array or more on a substrate;
a main current electrode mounted alongside the array(s) of said semiconductor devices and connected with the substrate by a plurality of wires so that the main current electrode is commonly connected to each of the plurality of semiconductor devices via the substrate;
an insulated base covering said main current electrode and including an edge, on a side facing said semiconductor devices, shaped such that a portion of the edge overhangs an area of said main current electrode where said plurality of wires are connected; and
a drive electrode mounted on said base, and commonly connected to each of said semiconductor devices.

2. The apparatus according to claim 1, wherein the side facing said semiconductor devices is beveled.

3. The apparatus according to claim 1, wherein said plurality of wires are arranged along the array(s) of said semiconductor devices at equal or substantially equal distances.

4. A semiconductor apparatus, comprising:
a plurality of semiconductor devices mounted in one array or more on a substrate;
a first main current electrode mounted alongside the array(s) of said semiconductor devices and connected with the substrate by a plurality of wires so that the first main current electrode is commonly connected with all of the plurality of semiconductor devices via the substrate;
a second main current electrode mounted alongside the array(s) of said semiconductor devices opposite said first main current electrode through a mounting area of said semiconductor devices, and commonly connected to each of said plurality of semiconductor devices;

an insulated base covering said first main current electrode and including an edge, on a side facing said semiconductor devices, shaped such that a portion of the edge overhangs an area of said first main current electrode where said plurality of wires are connected; and a drive electrode mounted on said base, and commonly connected to each of said semiconductor devices.

5. The apparatus according to claim 4, wherein the side facing said semiconductor devices is beveled.

6. The apparatus according to claim 4, wherein said plurality of wires are arranged along the array(s) of said semiconductor devices at equal or substantially equal distances.

7. The apparatus according to claim 6, wherein said wires are shortest possible but long enough to connect said substrate to said first main current electrode.

8. The apparatus according to claim 6, wherein a first external terminal led outside from said first main current electrode and a second external terminal led outside from said second main current electrode are set opposite each other with the mounting area of said semiconductor devices between said terminals.

9. The apparatus according to claim 4, wherein said semiconductor device is a MOSFET (metal oxide semiconductor field-effect transistor), and said first and second main current electrodes are a drain electrode and a source electrode of the MOSFET, and said drive electrode is a gate electrode of the MOSFET.

* * * * *